United States Patent
Stentz et al.

(10) Patent No.: US 11,609,182 B2
(45) Date of Patent: Mar. 21, 2023

(54) MULTI-STAGE NONLINEAR PROCESS FOR EFFICIENT WAVELENGTH CONVERSION

(71) Applicant: CACI, Inc.—Federal, Arlington, VA (US)

(72) Inventors: Andrew John Stentz, Clinton, NJ (US); Arlee Virgil Smith, Albuquerque, NM (US); Jesse Joel Smith, Albuquerque, NM (US)

(73) Assignee: CACI, Inc.—Federal, Reston, VA (US)

( * ) Notice: Subject to any disclaimer, the term of this patent is extended or adjusted under 35 U.S.C. 154(b) by 314 days.

(21) Appl. No.: 16/898,332

(22) Filed: Jun. 10, 2020

(65) Prior Publication Data

US 2020/0386676 A1 Dec. 10, 2020

Related U.S. Application Data

(60) Provisional application No. 62/859,431, filed on Jun. 10, 2019.

(51) Int. Cl.
| | |
|---|---|
| *H01S 3/00* | (2006.01) |
| *G01N 21/35* | (2014.01) |
| *G01S 7/481* | (2006.01) |
| *G01S 17/894* | (2020.01) |
| *H01S 5/04* | (2006.01) |
| *H01S 5/00* | (2006.01) |

(52) U.S. Cl.
CPC .............. *G01N 21/35* (2013.01); *G01S 7/481* (2013.01); *G01S 17/894* (2020.01); *H01S 5/0092* (2013.01); *H01S 5/041* (2013.01)

(58) Field of Classification Search
None
See application file for complete search history.

(56) References Cited

U.S. PATENT DOCUMENTS

| | | | |
|---|---|---|---|
| 5,400,173 A * | 3/1995 | Komine | G02F 1/39 359/326 |
| 6,047,011 A * | 4/2000 | Cook | G02F 1/37 372/21 |
| 2005/0078718 A1* | 4/2005 | Spinelli | G02F 1/3532 372/21 |

FOREIGN PATENT DOCUMENTS

KR  20200035117 A  *  4/2020  ............. G01S 7/497

OTHER PUBLICATIONS

Armougom et al; Longwave Infrared Lidar based on Parametric Sources for Standoff Detection of Gaseous Chemicals; (2018); CLEO; pp. 1-2 (Year: 2018).*

* cited by examiner

*Primary Examiner* — Mark Hellner
(74) *Attorney, Agent, or Firm* — Tayan B. Patel

(57) ABSTRACT

Disclosed here are methods, devices, and systems for generating an output light beam for a pulsed laser. An example method may comprise generating one or more pump optical beams comprising at least two photons having a pump wavelength. A first nonlinear stage may convert the at least two photons to a first photon having a first wavelength that is half of the pump wavelength. The first optical beam may be caused to spatially overlap with a seed optical beam. At least two second nonlinear stages separated by a gap may be used to convert, based on the seed optical beam, the first photon to a second photon having a second wavelength and a third photon having a target wavelength greater than the pump wavelength. A third nonlinear stage may convert the second photon to a fourth photon and a fifth photon each having the target wavelength or having a wavelength within an offset range of the target wavelength.

20 Claims, 11 Drawing Sheets

MULTI-STAGE NONLINEAR PROCESS FOR EFFICIENT WAVELENGTH CONVERSION

CROSS-REFERENCE TO RELATED APPLICATIONS

This application is related to U.S. Provisional Patent Application No. 62/859,431 filed Jun. 10, 2019, which is hereby incorporated by reference for any and all purposes.

BACKGROUND

Numerous applications utilize lasers, such as pulsed lasers. Commercial applications include optical communications, three-dimensional imaging, tissue ablation, and material processing. Military applications include range finding, laser RADAR, target designation and active illumination. However, conventional devices may suffer from excessive power loss, noise, signal degradation, and other challenges when attempts are made to adapt these devices for high power pulses in certain wavelength ranges, such as mid-infrared and near-infrared ranges. Thus, there is a need for more sophisticated approaches for converting and generating beams for target wavelengths

SUMMARY

Disclosed here are methods, devices, and systems for generating an output light beam for a pulsed laser. An example method may comprise generating one or more pump optical beams comprising at least two photons having a pump wavelength. The method may comprise converting, by a first nonlinear stage, the at least two photons to a first optical beam comprising a first photon having a first wavelength that is half of the pump wavelength. The method may comprise causing the first optical beam to spatially overlap with a seed optical beam. The method may comprise converting, by at least two second nonlinear stages separated by a gap and based on the seed optical beam, the first photon to a second photon having a second wavelength and a third photon having a target wavelength greater than the pump wavelength. The method may comprise converting, by a third nonlinear stage, the second photon to a fourth photon and a fifth photon each having the target wavelength or having a wavelength within an offset range of the target wavelength.

An example converter may comprise a first nonlinear stage configured to receive one or more pump optical beams comprising at least two photons having a pump wavelength and convert the at least two photons to a first photon in a first optical beam and having a first wavelength that is half of the pump wavelength. The converter may comprise at least two second nonlinear stages separated by a gap and configured to convert, based on a seed optical beam spatially overlapped with the first optical beam, the first photon to a second photon having a second wavelength and a third photon having a target wavelength greater than the pump wavelength. The converter may comprise a third nonlinear stage configured to convert the second photon to a fourth photon having the target wavelength and a fifth photon having the target wavelength or a wavelength within an offset range of the target wavelength.

An example system may comprise a first laser configured to generate one or more pump optical beams comprising at least two photons having a pump wavelength, a first nonlinear stage configured to convert the at least two photons to a first photon in a first optical beam and having a first wavelength that is half of the pump wavelength, and a multiplexer configured to cause the first optical beam to spatially overlap with a seed optical beam. The system may comprise at least two second nonlinear stages separated by a gap and configured to convert, based on the seed optical beam, the first photon to a second photon having a second wavelength and a third photon having a target wavelength greater than the pump wavelength. The system may comprise a third nonlinear stage configured to convert the second photon to a fourth photon having the target wavelength and a fifth photon having the target wavelength or a wavelength within an offset range of the target wavelength.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

Additional advantages will be set forth in part in the description which follows or may be learned by practice. It is to be understood that both the foregoing general description and the following detailed description are exemplary and explanatory only and are not restrictive.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF ILLUSTRATIVE EMBODIMENTS

Figure 1:
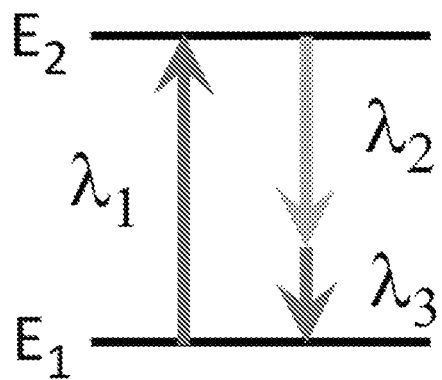
FIG. 1 shows an example energy-level diagram for optical parametric conversion.

Numerous applications utilize pulsed lasers. Commercial applications include optical communications, three-dimensional imaging, tissue ablation, and material processing. Military applications include range finding, laser RADAR, target designation and active illumination.

For many applications, it is important for the optical beam generated by a laser to have good "beam quality." Beam quality is typically characterized with the beam-quality factor, $M^2$, which is proportional to the angular spread of an optical beam on propagation. An ideal beam with a Gaussian-shaped transverse intensity profile has a beam quality factor of 1. It is common for the radius of a Gaussian beam to be defined as the transverse distance from the optical axis where the optical intensity is $1/e^2$ of the on-axis intensity. It is well known that an ideal Gaussian beam with a beam radius $\omega_0$ at its focus will experience diffractive spreading on propagation to have a radius of $\sqrt{2}\omega_0$ at a distance from the focal plane known as the Rayleigh range, given by the expression $$z_R = \frac{\pi n \omega_0^2}{\lambda}$$

where n is the index of refraction of the medium through which the beam is propagating and $\lambda$ is the wavelength of the light. Beams generated by lasers have beam-quality factors greater than or equal to 1. Good beam quality makes possible focusing of an optical beam to a small spot size, an important feature for many material processing and tissue-ablation applications. Good beam quality also minimizes diffractive beam spreading on propagation over long distances, an important feature for free-space-optical communication systems and long-range sensors.

For many applications, it is advantageous to generate trains of highly energetic pulses of short duration at high pulse repetition frequencies. Pulses of high energy and short duration with a large optical intensity that can ablate a wide range of materials or transmit through highly absorptive links, for example. Pulse trains with highly energetic pulses and high repetition frequencies have high average power that can be used for greater scanning rates, for example.

For many applications, it is important for a laser system to generate "eye-safe" wavelengths. The human eye can be safely exposed to greater optical intensities at eye-safe wavelengths since a significant fraction of the light is absorbed by the cornea. For those wavelengths where the cornea is largely transparent, the eye efficiently focuses the light onto the retina, posing a greater risk of permanent damage. In most cases, wavelengths greater than 1400 nm are more eye-safe than wavelengths less than 1400 nm.

For some applications, it is essential that the optical beam can be detected by a highly sensitive, efficient, and practical detector or detector array. For example, active illumination, laser RADAR and free-space-optical communications require sensitive detectors. Photodetectors made from silicon, indium gallium arsenide phosphide, or indium gallium arsenide are some of the most attractive detectors for many applications due to their low dark current, good sensitivity and ability to operate at room temperature. In combination, these detectors provide good photodetection over the wavelength range of about 400 to about 1700 nm. It is often advantageous for a laser to operate within this wavelength range.

The wavelength range from about 1530 to about 1605 nm is particularly attractive for some applications. Most long-haul, fiber-optic communication systems operate in this range where optical fibers have their lowest transmission losses and where fiber-optic amplifiers doped with the rare-earth element erbium can be made to work well. As a result, there exists a large number of fiber-optic components optimized for this wavelength range that can be used to construct laser systems. As discussed further herein, the present disclosure may comprise a device that outputs laser signals in the range from about 1530 nm to about 1605 nm.

For most applications, it is advantageous for a laser to be electrically powered. The most efficient electrically powered lasers are based on semiconductor optical amplifiers. While semiconductor lasers can be pulsed, they cannot provide the high peak powers required for many pulsed laser applications since they are limited by facet damage and an inability to store the energy provided by their electrical power source.

Often the light generated by a semiconductor laser is used to excite or "pump" another laser. These optically pumped lasers are often based on a gain medium doped with a rare-earth ion. Rare-earth ions can absorb and store energy from semiconductor pump lasers, releasing the accumulated energy into short pulses created by a pulsed laser system.

It is common for semiconductor pump lasers to be made from gallium arsenide or aluminum gallium arsenide and to produce light in the wavelength range 780-980 nm. Certain wavelengths in this range can be used to pump the rare-earth elements ytterbium and neodymium. Each of these ions can be optically pumped between 780-980 nm, and each has an attractive transition that generates light at a wavelength slightly greater than 1000 nm. The specific wavelengths of the absorbing and emitting wavelengths also depend on the host medium, of which there are many, both amorphous and crystalline.

It is possible to make highly efficient optical amplifiers and lasers based on rare-earth-doped optical fibers. By definition, these devices are much longer than they are wide. Their long lengths enable the construction of amplifiers with large optical gain. Disadvantageously, their small cross-sectional area limits their output pulse intensity due to optical nonlinearities and their output pulse energy due to gain saturation.

Lasers that generate large peak powers and pulse energies are typically built with bulk gain media. Often a bulk, crystalline host doped with rare-earth ions is used. A common gain medium is Yttrium Aluminum Garnet (YAG) doped with ytterbium, known as Yb:YAG. This gain medium can be pumped by the wavelengths of 940 and 969 nm and is typically used to amplify light at about 1030 nm. Ytterbium has no optical transition in the 1530-1605 nm band. The rare-earth element erbium is typically used to amplify light in the 1530-1605 nm wavelength range, usually in optical fibers. While bulk erbium-doped lasers can be made to work, their laser performance is severely limited at the required doping concentrations by parasitic cooperative up-conversion between neighboring erbium ions.

A common approach to generating highly energetic, short optical pulses near 1550 nm is to generate an optical pulse near 1000 nm and to change the wavelength of the light using nonlinear optics. Of particular interest is a process known as optical parametric down conversion. FIG. 1 shows an example energy-level diagram with optical transitions illustrating optical parametric down conversion. An input photon of wavelength $\lambda_1$ is destroyed and two photons of longer wavelengths $\lambda_2$ and $\lambda_3$ are created.

Energy may be conserved, as shown in FIG. 1. Given that a photon's energy is inversely proposal to its wavelength, the sum of the inverse of the input photons equals the sum of the inverse of the output wavelengths. In this case, $$\frac{1}{\lambda_1} = \frac{1}{\lambda_2} + \frac{1}{\lambda_3}$$

Crystals with significant second-order optical nonlinear susceptibilities are advantageously used for parametric optical down conversion. Commonly used second-order crystals include lithium triborate (LBO), monopotassium phosphate, barium borate, potassium niobite, lithium iodate and periodically poled lithium niobite. Of these crystals, LBO is a crystal of interest as it is exceptionally chemically, mechanically, and optically robust with a wide transparency range and a reasonably large nonlinear susceptibility.

In order to achieve efficient transfer of energy from the input to output waves, optimum relative phases of the waves may be achieved throughout the crystal. This "phase-matching" requirement may be met by adjusting one or more the orientation of the nonlinear crystal, the temperature of the nonlinear crystal, the propagation vectors of the interacting waves, the polarizations of the interacting waves, or a combination thereof. An arrangement of particular interest is called "NonCritical Phase Matching" (NCPM). In this arrangement, the interacting waves may propagate along an axis of a birefringent crystal. The temperature of the crystal may be adjusted to cause phase matching between the two propagating waves. This arrangement has the advantage of avoiding spatial walk-off of the interacting waves and is relatively insensitive to small angular misalignments of the beams.

Figure 2:
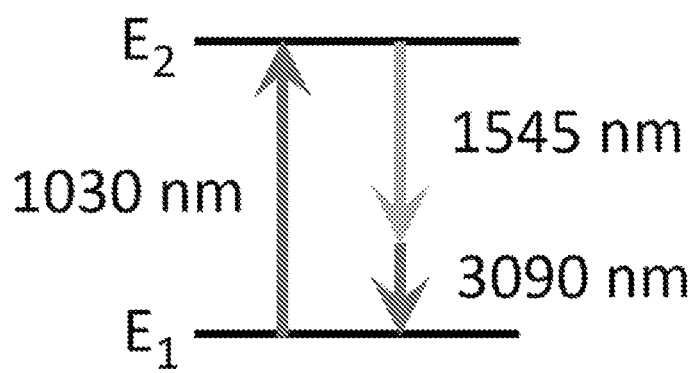
FIG. 2 shows an example energy-level diagram of an optical parametric down-conversion process pumped by 1030 nm light.

A specific example of parametric down conversion is illustrated by FIG. 2, which shows an example energy-level diagram of an optical parametric down-conversion process pumped by 1030 nm light. Light may be generated at 1545 nm with the 1030 nm output of a Yb:YAG laser using the parametric down conversion process.

This process can be made to work well for trains of highly energetic pulses if the pulse repetition frequency is sufficiently low. At high repetition frequencies, the average power generated at the longest wavelength becomes problematic due to the nonlinear crystal's absorption in the mid-wave infrared. Consider for example, the absorption spectrum of LBO plotted in FIG. 3. This figure shows an example transmission through a 1 cm length of lithium triborate versus wavelength. Absorption of the mid-wave infrared creates a thermal load on the crystal that leads to de-phasing of the interacting waves and other deleterious thermo-optic effects. This figure illustrates that there is a need for a parametric down converter that converts trains of highly energetic optical pulses at near-infrared wavelengths and at high pulse repetition frequencies to eye-safe wavelengths with good efficiency and while maintaining good beam quality.

Figure 4:
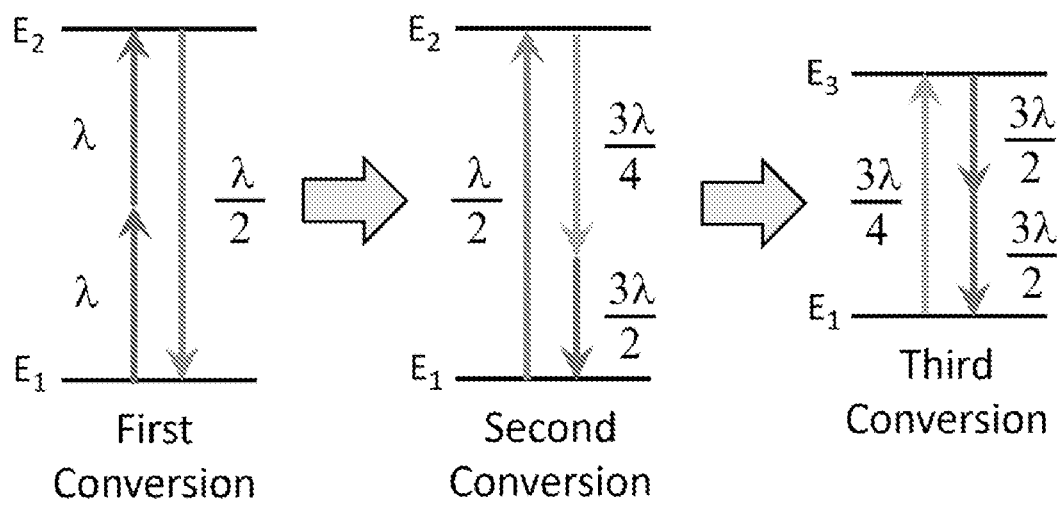
FIG. 4 shows energy-level diagrams for an example optical conversion processes as disclosed herein.
Figure 5:
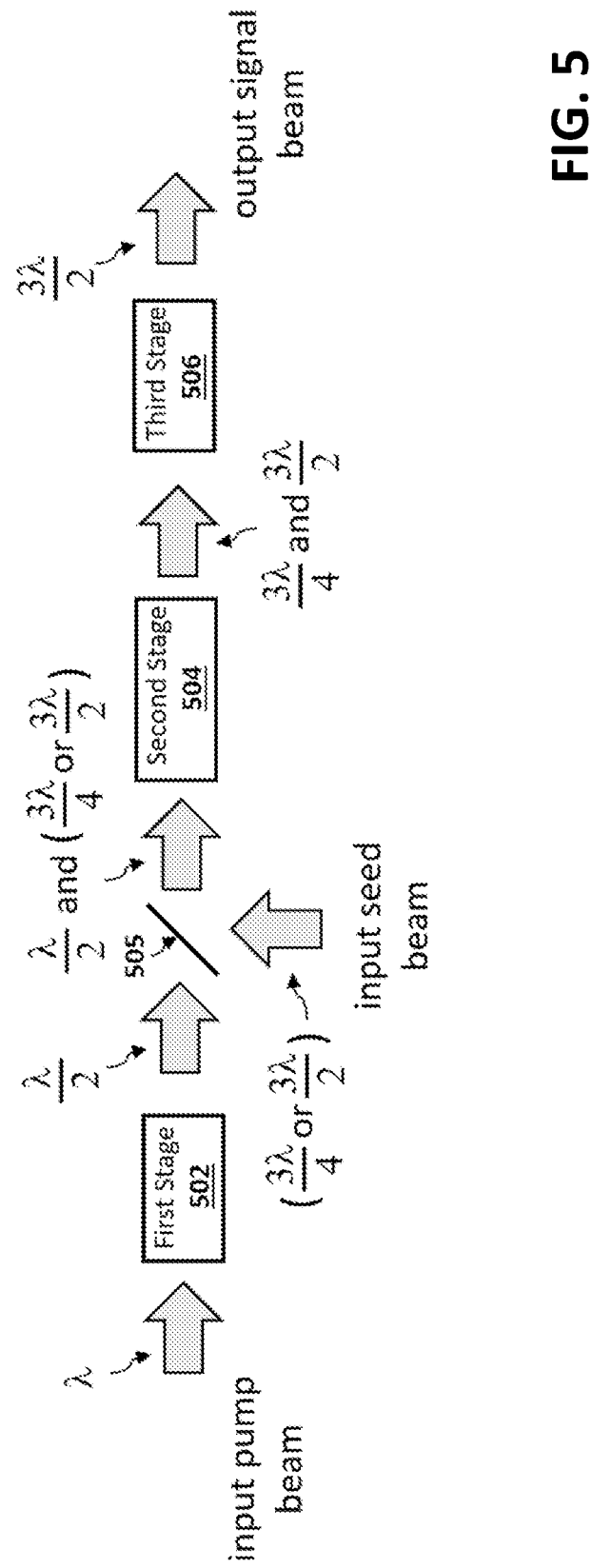
FIG. 5 is a diagram showing an example optical converter and corresponding conversion process according to the present disclosure.
Figure 6:
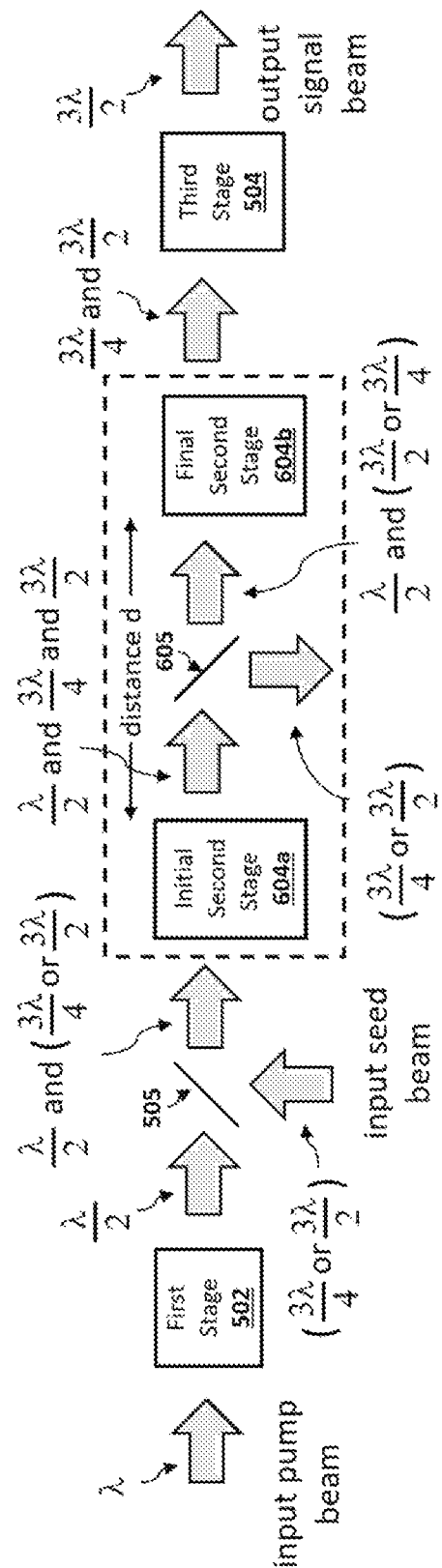
FIG. 6 shows another example converter with an additional stage.

FIG. 4 shows an energy-level diagrams for an example optical conversion processes as disclosed herein. It should be noted that the specific wavelengths shown in FIGS. 4-6 are to be understood as non-limiting examples used to illustrate the present disclosure. An optical converter may be configured to convert (e.g., via a plurality of stages) two input photons into three output photons. The output wavelength of the three photons may be greater than the input wavelength of the two photons. The output wavelength may be $3/2$ (e.g., or about $3/2$ greater) times greater the input wavelength. The example optical converter may comprise a multi-stage nonlinear optical converter, as shown in FIG. 5 or FIG. 6.

The optical converter may be configured to perform one or more a first conversion, a second conversion, or a third conversion, as shown in FIG. 4. The term conversion (e.g., and its variants, such as converting) as used herein refers to any process in which an input results in a corresponding output (e.g., and at least part of the output is different that at least part of the input). Conversion may comprise destroying (e.g., or absorbing) a beam, photon, wave, and/or the like to generate a new beam, photon, wave, and/or the like. For example, a beam may comprise a plurality of photons. One of the plurality of photons of the beam may be destroyed to generate two photons. Multiple photons of the plurality of photons may be converted into a single photon. Conversion may comprise modifying an input beam, photon, wave, and/or the like, resulting in a modified beam, photon, wave, and/or the like. The modified beam, photon, wave, and/or the like may be output along with a newly generated beam, photon, wave, and/or the like. Conversion may rely on a nonlinear process and/or other process. Each of the first conversion, second conversion, and/or third conversion may be performed using one or more conversion stages.

The term beam as used herein may refer to an electromagnetic wave having substantially one wavelength. It should be understood that the wavelength of a beam may vary over time due to changes in propagation mediums as well any other non-uniformities or factors. The beam may be localized and propagating in the direction of travel. Beams with different wavelengths propagating in the same local space at the same time are described herein as spatially overlapping beams. A beam may comprise one or more photons and/or waves. Two photons with different wavelengths output from the same optical element may be understood as two separate but spatially overlapping beams.

As shown in FIG. 4, the first conversion may comprise converting two photons (e.g., first beams, first waves) of having a pump wavelength (e.g., wavelength $\lambda$) to a first photon (e.g., second beam, second wave) having a first wavelength (e.g., wavelength $\lambda/2$). The second conversion may comprise converting the first photon (e.g., wavelength $\lambda/2$) to a second photon (e.g., second beam, second wave) and a third photon (e.g., third beam, third wave). The second photon may comprise a second wavelength (e.g., wavelength $3\lambda/4$). The third photon may comprise a target wavelength (e.g., wavelength $3\lambda/2$). The third conversion may comprise converting the second photon to a fourth photon (e.g., fourth beam, fourth wave) and a fifth photon (e.g., fifth beam, fifth wave). The fourth photon may comprise the target wavelength. The fifth photon may comprise the target wavelength. The third photon may output with the fourth photon and the fifth photon.

Additionally or alternatively, the wavelength of the second photon may be shifted by an offset in wavelength $+\Delta\lambda$ (e.g., to wavelength $3\lambda/4+\Delta\lambda$), the wavelengths of the third and fourth photons may be shifted by an offset in wavelength $-2\Delta\lambda$ (e.g., to wavelength $3\lambda/2-2\Delta\lambda$), and the wavelength of the fifth photon may be shifted by an offset in wavelength $+4\Delta\lambda$ (e.g., to wavelength $3\lambda/2+4\Delta\lambda$).

FIG. 5 is a diagram showing an example optical converter and corresponding conversion process according to the present disclosure. The converter may comprise a nonlinear optical converter. The converter may comprise a first stage 502 (e.g., first nonlinear stage). The first stage 502 may comprise a first nonlinear converter, such as a nonlinear crystal. The converter may comprise a second stage 504 (e.g., second nonlinear stage). The second stage 504 may comprise a second nonlinear converter, such as a nonlinear crystal. The converter may comprise a third stage 506 (e.g., third nonlinear stage). The third stage 506 may comprise a third nonlinear converter, such as a nonlinear crystal.

The first stage 502 may be optically coupled to a laser. The first stage 502 may be aligned with the laser to receive signals from the laser via free space. The first stage 502 may be configured to receive one or more pump signals (e.g., pump beam, pump photon, pump light wave) from the laser. The first stage 502 may comprise a nonlinear optical element, such as a nonlinear crystal, a nonlinear converter, a nonlinear amplifier, a nonlinear oscillator, a nonlinear mix, a parametric mixer, or a combination thereof. The nonlinear optical element may be positioned with a geometric orientation (e.g., crystal orientation). For example, the nonlinear element may comprise an X-cut material. The first stage 502 may comprise a nonlinear optical material. The first stage 502 may comprise lithium triborate (LBO). The first stage 502 may be set at a first temperature. As an example, for an X-cut nonlinear crystal comprising LBO, the first temperature may be in a range of about 410 K to about 480 K.

The first stage 502 may be configured to perform the first conversion (e.g., shown in FIG. 4). An input pump beam at pump wavelength (e.g., wavelength $\lambda$) may be injected into the first stage 502 (e.g., a first nonlinear converter). The input pump beam may comprise at least two photons having the pump wavelength. The first stage 502 may be configured to create an output (e.g., beam, wave) with an optical frequency twice that of the input pump beam (e.g., wave). The resulting output may comprise a wavelength (e.g., wavelength of $\lambda/2$) that is lower than the pump wavelength. The at least two photons having the pump wavelength may be converted to a first photon having the first wavelength. It should be noted that the first stage 502 may pass some portion of the input light (e.g., other photons besides the at least two photons in the pump beam) to its output. This output at the pump wavelength (e.g., wavelength $\lambda$) may be filtered from the optical train, absorbed (e.g. to manage the waste heat and prevent transmission to the output of the device), and/or it may be passed through the system. The output at the pump wavelength may not be used for a constructive role in the device and will not be further discussed.

The first stage 502 may have a length that is optimized based on an output design criterion. The length of the first stage 502 may be based on an expected pulse energy, pulse duration, spot size, damage thresholds of the material, tolerances on temperature and angular orientation, a residual phase-mismatch, and/or the like. The length, spot size, temperature, material, orientation, and/or the like may be based on achieving a power-conversion efficiency and/or beam quality factor. For the first stage 502, the power-conversion efficiency may be defined as the total optical power at the output of the first stage 502 at the first wavelength (e.g., $\lambda/2$) divided by the total optical power at the input of the first stage 502 at the pump wavelength (e.g., wavelength $\lambda$). The power-conversion efficiency may be at least about 50% power conversion efficiency, at least about 70% power conversion efficiency, and/or the like. The beam quality factor of the output beams of the first stage 502 at the first wavelength (e.g., $\lambda/2$) may have a maximum value in a range of about 2 to about 1.1. Example beam quality factors may comprise 2.0, 1.5, 1.2 or 1.1.

The second stage 504 may be optically coupled to the first stage 502. The second stage 504 may receive an output of the first stage 502. The second stage 504 may be aligned with the first stage 502 to receive signals from the first stage 502 via free space. The second stage 504 may comprise a nonlinear optical element, such as a nonlinear crystal, a nonlinear converter, a nonlinear amplifier, a nonlinear oscillator, a nonlinear mix, a parametric mixer, or a combination thereof. In some implementations, as explained further below, the second stage 504 may be implemented via multiple stages, instead of a single stage. The second stage 504 may comprise LBO. The second stage 540 may be at a second temperature. As an example, for an X-cut nonlinear crystal comprising LBO, the second temperature may be in a range of about 370 K to about 425 K.

The second stage 504 may be configured to perform the second conversion (e.g., shown in FIG. 4). The second stage 504 may be configured to convert an input photon into multiple output photons. The multiple output photons may have a higher wavelength than the input photon. The second stage 504 may be configured to convert the first photon with the first wavelength (e.g., $\lambda/2$) into the second photon with the second wavelength (e.g., $3\lambda/4$) and the third photon with the target wavelength (e.g., $3\lambda/2$).

The phase-matching conditions established in the second stage 504 may not be specific enough to ensure that specific wavelengths, such as the second wavelength and target wavelength will be substantially generated. An input seed pulse (e.g., weak input seed pulse) may be supplied to (e.g., injected into) the second stage 504 (e.g., to address the phase-matching issue). The input seed pulse may comprise a seed photon (e.g., beam, wave) having the second wavelength (e.g., $3\lambda/4$) or the target wavelength (e.g., $3\lambda/2$). The input seed pulse may be supplied via a multiplexer 508. The multiplexer 508 may be optically coupled between the first stage 502 and the second stage 504 (e.g., in an optical path between the first stage 502 and the second stage 504).

The multiplexer 508 may comprise a wavelength-dependent multiplexer, such as a dichroic mirror. The multiplexer 508 may be configured to cause the output of the first stage (e.g., the first photon, a powerful beam at wavelength $\lambda/2$) to spatially overlap with the input seed beam (e.g., weak input seed beam at wavelength $3\lambda/2$ or $3\lambda/4$).

The second stage 504 may be configured to perform the second conversion at an optimal amount and/or rate (e.g., such that the overlapping beams at wavelengths $3\lambda/2$ or $3\lambda/4$ output from the second stage 504 are substantially powerful). It should be noted that the second stage 504 may pass some portion of the input signals at the first wavelength (e.g., $\lambda/2$) to its output. This output may be filtered from the optical path (e.g., or optical train), absorbed (e.g. to manage the waste heat and prevent transmission to the output of the device), and/or passed through the system. In either case, this portion of the output from the second stage 504 may provide no other constructive role in the device and will not be further discussed.

The second stage 504 may have a length that is optimized based on an output design criterion. The length of the second stage 504 may be based on an expected pulse energy, pulse duration, spot size, damage thresholds of the material, tolerances on temperature and angular orientation, a residual phase-mismatch, and/or the like. The length, spot size, temperature, material, orientation, and/or the like may be based on achieving a power-conversion efficiency and/or beam quality factor. For the second stage 504, the power-conversion efficiency may be defined to be the sum of the optical powers at the output of the second stage 504 at the target wavelength (e.g., $3\lambda/2$) and the second wavelength (e.g., $3\lambda/4$) divided by the optical power at the input of the second stage 504 at the first wavelength (e.g., $\lambda/2$). The power-conversion efficiency may be at least about 30% power conversion efficiency, at least about 50% power conversion efficiency, and/or the like. The beam quality factor of the output beams of the second stage 504 at the target wavelength (e.g., $3\lambda/2$) and the second wavelength (e.g., $3\lambda/4$) may have a maximum value in a range of about 2 to about 1.1. Example beam quality factors may comprise 2.0, 1.5, 1.2, or 1.1.

The third stage 506 may be optically coupled to the second stage 504. The third stage 506 may receive an output of the second stage 504. The third stage 506 may be aligned with the second stage 504 to receive signals from the second stage 504 via free space. The third stage 506 may comprise a nonlinear optical element, such as a nonlinear crystal, a nonlinear converter, a nonlinear amplifier, a nonlinear oscillator, a nonlinear mix, a parametric mixer, or a combination thereof. The third stage 506 may be configured based on a phase matching condition of the nonlinear optical element. A material, a temperature, an orientation of the material, wavelengths of input beams, or a combination thereof may be determined based on the phase matching condition. The nonlinear optical element may be positioned with a geometric orientation (e.g., crystal orientation). For example, the nonlinear element may comprise an X-cut material. The third stage 506 may comprise a nonlinear optical material. The third stage 506 may comprise lithium triborate (LBO). The third stage 506 may be set at a third temperature. As an example, for an X-cut nonlinear crystal comprising LBO, the third temperature may be in a range of about 365 K to about 445 K.

The third stage 506 may have a length that is optimized based on an output design criterion. The length of the third stage 506 may be based on an expected pulse energy, pulse duration, spot size, damage thresholds of the material, tolerances on temperature and angular orientation, a residual phase-mismatch, and/or the like. The length, spot size, temperature, material, orientation, and/or the like may be based on achieving a power-conversion efficiency and/or beam quality factor. For the third stage 506, the power-conversion efficiency may be defined to be the sum of the optical power at the output of the third stage 506 at the target wavelength (e.g., $3\lambda/2$) divided by the sum of the optical powers at the input of the third stage at the target wavelength (e.g., $3\lambda/2$) and the second wavelength (e.g., $3\lambda/4$). The power conversion may be at least about 40% power conversion efficiency, at least about 70% power conversion efficiency, and/or the like. The beam quality factor of the output beams of the third stage of the target wavelength (e.g., $3\lambda/2$) may have a maximum value in a range of about 2 to about 1.1. Example beam quality factors may comprise 2.0, 1.5, 1.2 or 1.1. The third stage 506 may be configured to perform the third conversion (e.g., shown in FIG. 4). The third stage 506 may be designed (e.g., configured, optimized) to convert input signals (e.g., photons, beams, waves) at the second wavelength (e.g., $3\lambda/4$) into output signals at the target wavelength (e.g., $3\lambda/2$). The input signals may comprise the second photon at the second wavelength. The input signals may comprise the third photon at the target wavelength. The third photon may stimulate the second photon to convert to the fourth photon and the fifth photon. The fourth photon may be at the target wavelength. The fifth photon may have the target wavelength (e.g. or substantially the target wavelength, such as a wavelength offset from the target wavelength by about 1% or less). The third photon at the target wavelength may by output from the third stage 506 along with the fourth photon and the fifth photon. These three photons (e.g., the third photon, fourth photon, and the fifth photon) may be output from the converter (e.g., via the third stage 506). The three photons may be output via one or more pulse, such as gaussian pulses. The three photons may be output into free space, output into a fiber, or a combination thereof.

Advantageously, the input seed beam should have good beam quality, preferably with $M^2<1.2$. If pulsed, the input seed pulses may be synchronized with the input pump pulses such that the interacting waves temporally overlap in the second stage 504. The input seed beam may be sufficiently weak that it can be generated by a pulsed semiconductor laser, a pulsed semiconductor laser whose output is amplified with a fiber-optic amplifier, and/or a continuous-wave semiconductor laser whose output is carved into a pulse train with an electro-optic modulator and subsequently amplified by a fiber-optic amplifier. These technologies are well suited to generate beams of good beam quality, pulses of short duration that can be easily synchronized to an electronic signal, and specific wavelengths over a wide range of wavelengths. Furthermore, if a required seed wavelength is near 1550 nm, a wide assortment of fiber-coupled components is commercially available with which to construct the seed source.

Figure 3:
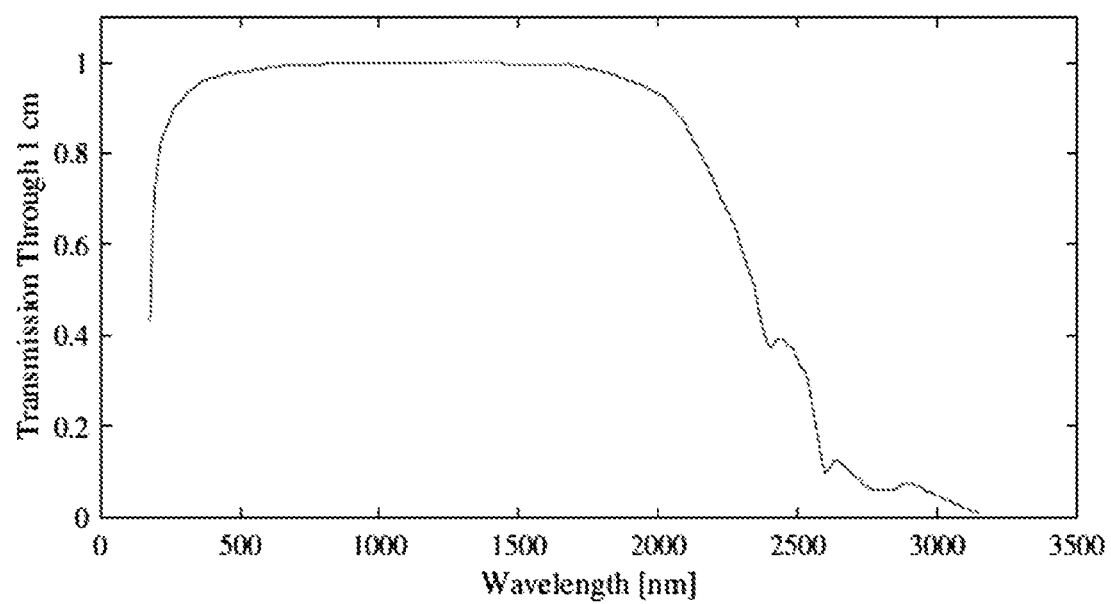
FIG. 3 is a graph showing example transmission through a 1 cm length of lithium triborate versus wavelength.

The three-step conversion process described by FIG. 4 and FIG. 5 has important advantages over the single-step down-conversion process illustrated by FIG. 1. In the single-step process, the energy converted to the undesired wavelength is necessarily lost, setting a fundamental limitation to the maximum conversion efficiency. No such limitation exists for the three-step process which could have a conversion efficiency of 100%. Secondly, if the single-step process is designed for high conversion efficiency, it necessarily generates unwanted light at long wavelengths where attractive candidate nonlinear crystals may have significant absorption. Such is the case for the example shown in FIG. 2 when using LBO as the nonlinear crystal. In contrast, the wavelengths used in the three-step process range from $\lambda/2$ to $3\lambda/2$. Note that for a 1030 nm pump wavelength, this wavelength range is 515 nm to 1545 nm, which are in the range where LBO has exceedingly high optical transmission as shown in FIG. 3.

The optical gain from the second stage 504 may be required to be high for some applications. Typical peak power available from pulsed semiconductors laser may be in a range of 100 mW to a few Watts. If amplified by a rare-earth-doped fiber, peak output powers are typically in a range of about 100 W to about 10 kW, depending on the details of the optical fiber design. In contrast, many applications for pulsed lasers may require peak powers ranging from 1 to 10's of MW. Therefore, efficient operation of the second stage may rely on an optical gain of 10's of dBs. Attempts to generate large parametric gain (e.g. 30 dB) in a single-step, single-crystal design may create either spatially narrowed output beams with poor conversion efficiency or a highly distorted output beam profile. The root cause of these effects may be that the parametric gain is directly proportional to the pump intensity, and the pump beam typically has a Gaussian transverse beam profile. As the signal is amplified, the middle of the signal beam experiences much more gain than the wings, dramatically narrowing the signal beam shape. If the interaction is allowed to continue to improve conversion efficiency, eventually the wings of the beam are efficiently amplified but only after the center of the beam has reached its maximum conversion and has started to transfer energy back to the pump beam, creating a local minimum in the middle of the output signal beam.

Disclosed herein are additional aspects that overcome the limitations of a single-crystal design for the second stage 504. FIG. 6 shows another example converter with an additional stage. The converter of FIG. 6 may apply a multi-stage approach to the second conversion process of FIG. 4. The converter of FIG. 6 may include any of the features of the converter of FIG. 5. For example, the converter of FIG. 6 may comprise the first stage 502, the multiplexer 508, the third stage 506, or a combination thereof of the converter of FIG. 5. Instead of the second stage 504, the converter of FIG. 6 may comprise the stages and/or other optical elements shown in the dashed box of FIG. 6.

The converter of FIG. 6 may comprise an initial second stage 604a and a final second stage 604b. The initial second stage 604a and the final second stage 604b may be separated by a gap (e.g., shown as distance d). A wavelength demultiplexer 605 may be optically coupled between the initial second stage 604a and the final second stage 604b.

The initial second stage 604a may comprise a nonlinear optical element, such as a nonlinear crystal, a nonlinear converter, a nonlinear amplifier, a nonlinear oscillator, a nonlinear mix, a parametric mixer, or a combination thereof. The nonlinear optical element may be positioned with a geometric orientation (e.g., crystal orientation). For example, the nonlinear element may comprise an X-cut material. The initial second stage 604a may comprise a nonlinear optical material. The initial second stage 604a may comprise lithium triborate (LBO). The initial second stage 604a may be set at a fourth temperature. As an example, for an X-cut nonlinear crystal comprising LBO, the fourth temperature may be in a range of about 370 K to about 425 K.

The initial second stage 604a may have a length that is optimized based on an output design criterion. The length of the initial second stage 604a may be based on an expected pulse energy, pulse duration, spot size, damage thresholds of the material, tolerances on temperature and angular orientation, a residual phase-mismatch, and/or the like. The length, spot size, temperature, material, orientation, and/or the like may be based on achieving a seed optical gain and/or beam quality factor. For the initial second stage 604a, seed optical gain may be defined to be the optical power at the output of the initial second stage 604a at the wavelength of the input seed beam (e.g., $3\lambda/2$ or $3\lambda/4$) divided by the optical power at the input of the initial second stage 604a at the wavelength of the input seed beam (e.g., $3\lambda/2$ or $3\lambda/4$). The seed optical gain may be at least about 10, at least about 40, and/or the like. The beam quality factor of the output beams of the initial second stage 604a at the first wavelength (e.g., $\lambda/2$) may have a maximum value in a range of about 2 to about 1.1. Example beam quality factors may comprise 2.0, 1.5, 1.2, or 1.1.

The final second stage 604b may comprise a nonlinear optical element, such as a nonlinear crystal, a nonlinear converter, a nonlinear amplifier, a nonlinear oscillator, a nonlinear mix, a parametric mixer, or a combination thereof. The nonlinear optical element may be positioned with a geometric orientation (e.g., crystal orientation). For example, the nonlinear element may comprise an X-cut material. The final second stage 604b may comprise a nonlinear optical material. The final second stage 604b may comprise lithium triborate (LBO). The final second stage 604b may be set at a fifth temperature. As an example, for an X-cut nonlinear crystal comprising LBO, the fifth temperature may be in a range of about 370 K to about 425 K.

The final second stage 604b may have a length that is optimized based on an output design criterion. The length of the final second stage 604b may be based on an expected pulse energy, pulse duration, spot size, damage thresholds of the material, tolerances on temperature and angular orientation, a residual phase-mismatch, and/or the like. The length, spot size, temperature, material, orientation, and/or the like may be based on achieving a power-conversion efficiency and/or beam quality factor. For the final second stage 604b, the power-conversion efficiency may be defined to be the sum of the optical powers at the output of the final second stage 604b at the target wavelength (e.g., $3\lambda/2$) and the second wavelength (e.g., $3\lambda/4$) divided by the optical power at the input of the final second stage 604b at the first wavelength (e.g., $\lambda/2$). The power-conversion efficiency may be at least about 40% power conversion efficiency, at least about 60% power conversion efficiency, and/or the like. The beam quality factor of the output beams of the final second stage 604b at the target wavelength (e.g., $3\lambda/2$) and the second wavelength (e.g., $3\lambda/4$) may have a maximum value in a range of about 2 to about 1.1. Example beam quality factors may comprise 2.0, 1.5, 1.2 or 1.1.

The initial second stage 604a may be configured to cause a gain in a range of about 10 to about 120. The initial second stage 604a may output one or more spatially narrowed Gaussian outputs (e.g., beam comprising photons) at the target wavelength (e.g., $3\lambda/2$) and the second wavelength (e.g., $3\lambda/4$). A sixth photon at the target wavelength and a seventh photon at the second wavelength may be output. The sixth photon and the seventh photon may be generated based on a photon having the first wavelength and/or a photon of the input seed beam. Additional photons (e.g., generated from the first stage 502) at the first wavelength (e.g., $\lambda/2$) may also be output by the initial second stage 604a. The additional photons may pass through the initial second stage 604. The output (e.g., photons, beams, waves) by the initial second stage 604 may be supplied to the wavelength demultiplexer 605. Photons of the target wavelength (e.g., $3\lambda/2$) or second wavelength (e.g., $3\lambda/4$) may be filtered, converted, discarded, and/or the like by the wavelength demultiplexer 605.

The remaining unfiltered portions (e.g., photons, beams) may pass through the wavelength demultiplexer 605. The unfiltered output of the demultiplexer 605 may be supplied to the final second stage 604b. The input to the final second stage 604b may comprise a first input (e.g., photon, beam, wave) at the first wavelength (e.g., $\lambda/2$, the remains of the original powerful output of the first stage 502), such as a beam comprising the additional photons. The input to the final second stage may also comprise a second input (e.g., photon, beam, wave) with either the second wavelength (e.g., $3\lambda/4$) or the target wavelength (e.g., $3\lambda/2$), such as the sixth proton or the seventh proton. These two inputs may co-propagate from the output of the demultiplexer to the input of the final second stage 604b.

The second input (e.g., $3\lambda/2$ or $3\lambda/4$) may experience more diffractive spreading during propagation in the gap (e.g., from the demultiplexer 605 to the final second stage 604b) than the first input (e.g., $\lambda/2$) due to its larger wavelength. The gap distance may be of a length that allows for a diameter (e.g., beam diameter, or beam width) of the second input to match (e.g., after expanding, match within a threshold, below or above the threshold) a diameter (e.g., beam diameter, or beam width) of the first input. The gap distance (e.g., shown as distance d) may be of a length (e.g., that is adjusted, selected, determined) that allows the longer-wavelength beam (e.g., the second input) to expand during propagation, compensating for spatial beam narrowing that occurred in the initial second stage 604a.

By way of further explanation, an input pump beam at pump wavelength $\lambda$ may be injected into the first stage 502 without another wavelength. A first optical beam at first wavelength $\lambda/2$ may grow based on noise. The first optical beam may have a relative phase that maximizes energy transfer. At the initial second stage 604a, only two (e.g., beams/waves at the first wavelength and either the target wavelength or second wavelength) of the three interacting waves (e.g., the three that interact in the initial second stage 604a) may be injected into the initial second stage 604a, allowing the third wave (e.g., or beam, with the target wavelength or second wavelength) to grow with the optimum phase to maximize energy transfer. The demultiplexer 605 positioned between the initial second stage 604a and the final second stage 604b may filter one of the two low-power beams at either the second or target wavelength (e.g., $3\lambda/4$ or $3\lambda/2$) so that only two of the three waves will interact in the final second stage 604b. If all three interacting waves are injected into the final second stage 604b, care may be taken to adjust the relative phases of the waves at the input of the final second stage 604b to ensure that energy would flow from the powerful beam at the first wavelength (e.g., $\lambda/2$) into the low power beam instead of vice versa. Since the discarded wave is low power, only a small efficiency hit is taken by discarding this power.

Figure 7:
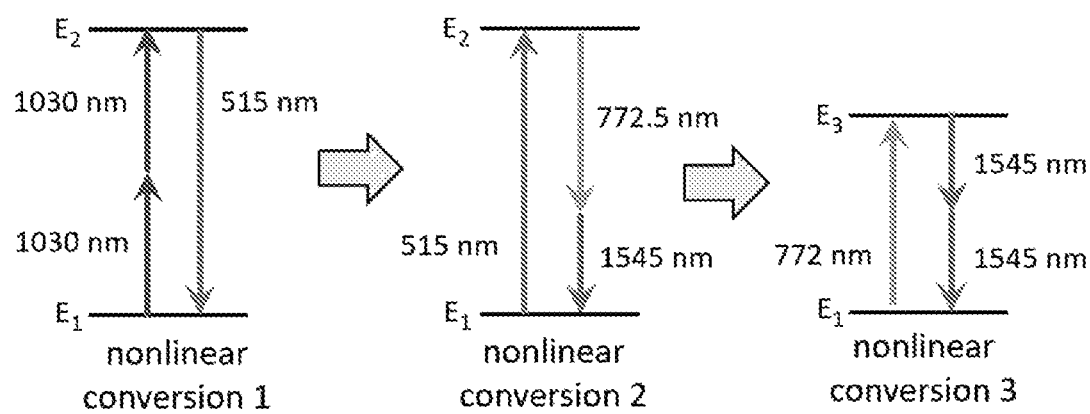
FIG. 7 shows energy level diagrams of a three-step nonlinear optical converter that converts two input photons at 1030 nm to three output photons at 1545 nm.
Figure 8:
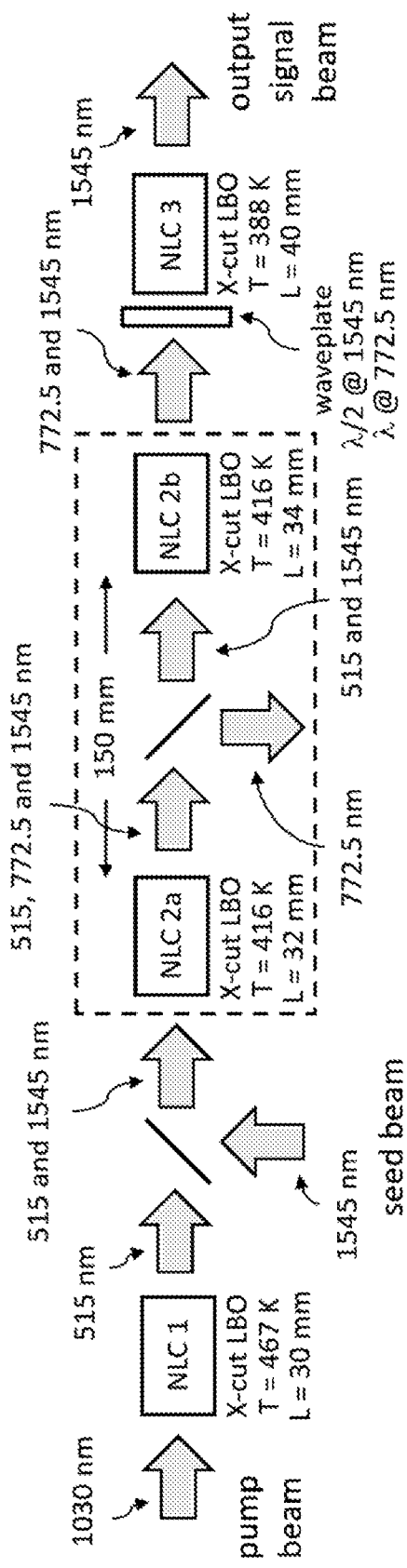
FIG. 8 shows an illustration of the physical layout of a nonlinear converter that uses four X-cut LBO crystals to convert input pump power at 1030 nm into an output signal at 1545 nm with good efficiency and good output beam quality.

A specific example of the general design illustrated by FIGS. 4, 5, and 6 is described below. It should be understood that the present disclosure is not limited to the details and features of this specific example. FIG. 7 shows energy level diagrams of a three-step nonlinear optical converter that converts two input photons at 1030 nm to three output photons at 1545 nm. FIG. 8 shows an illustration of the physical layout of a nonlinear converter that uses four X-cut LBO crystals to convert input pump power at 1030 nm into an output signal at 1545 nm with good efficiency and good output beam quality. The first stage, second stage, and third stages may be implemented as nonlinear converters (NLC), such as NLC 1, NLC 2a, NLC2b, and NLC3.

The input to the NLC 1 may be a pulse of light with a wavelength of 1030 nm, a pulse duration of 2.2 ns (Full-Width Half-Maximum (FWHM)) with a fourth-order super-Gaussian temporal profile, a Gaussian spatial profile with a FWHM of 0.5 mm, and a pulse energy of 1.75 mJ. The NLC 1 may comprise a nonlinear crystal. The NLC may comprise (e.g., consists of) a single X-cut LBO crystal that is 30 mm long and at a temperature of approximately 467 K. The 1030 nm wave may be polarized on the ordinary axis; the 515 nm wave on the extraordinary axis. The NLC 1 converter may produce an output pulse of the same duration as the input pulse. The output pulse may have a nearly transform-limited beam profile and a pulse energy of 1.5 mJ at 515 nm. Perfect phase matching may be assumed for the purposes of simulation.

Figure 9:
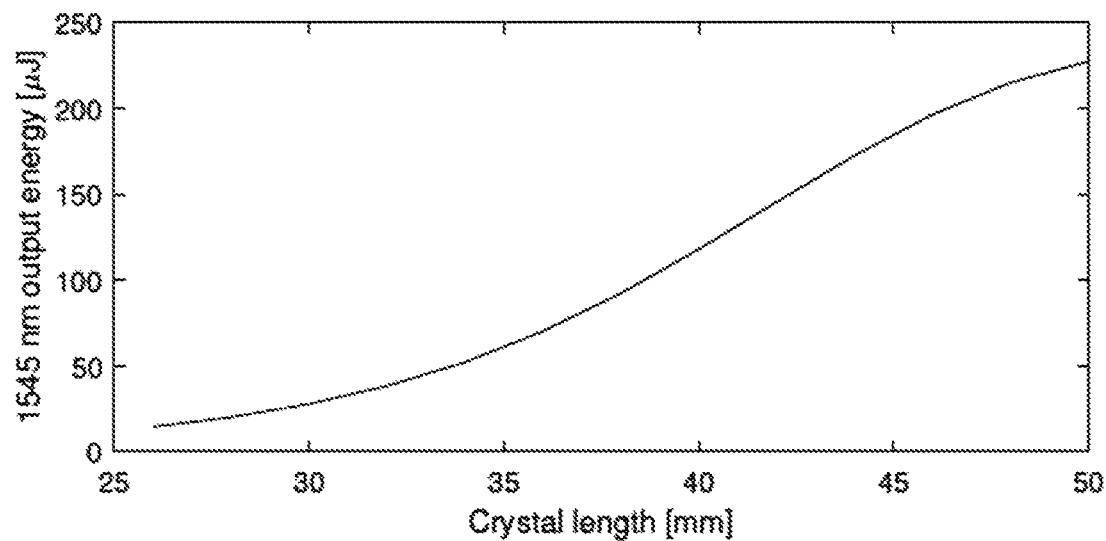
FIG. 9 shows a plot of the output pulse energy of the 1545 nm beam after NLC 2a as a function of crystal length.
Figure 10:
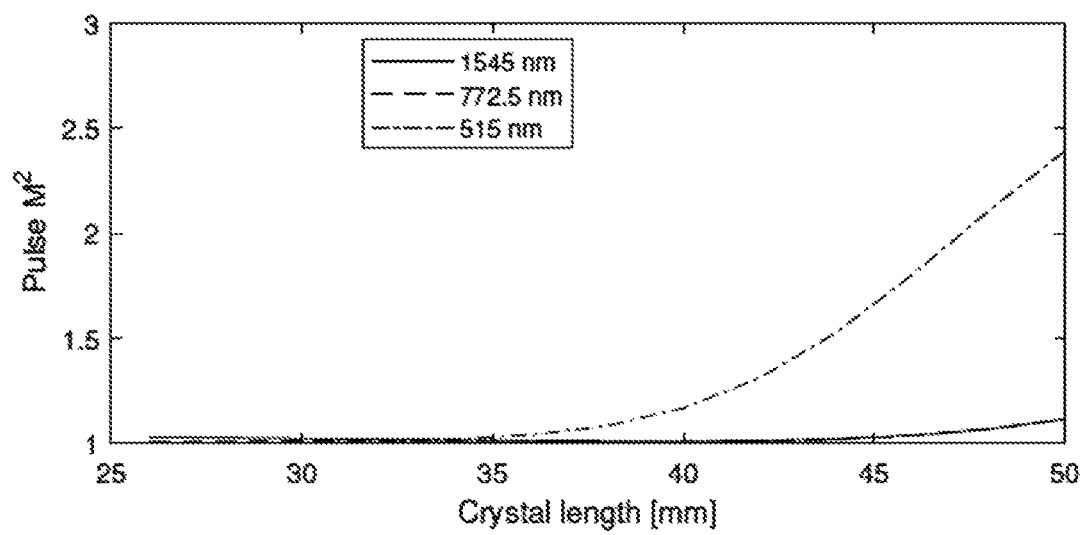
FIG. 10 shows a plot of the beam quality factor of the three output beams from NLC 2a as a function of crystal length.

The output of NLC 1 may be multiplexed with a weak input seed beam. The weak input seed beam may have with a wavelength of 1545 nm, a pulse duration of 2.2 ns (Full-Width Half-Maximum (FWHM)) with a fourth-order super-Gaussian temporal profile, a Gaussian spatial profile with a FWHM of 0.5 mm, and a pulse energy of 1 µJ. These spatially overlapping beams (e.g., the output of NLC 1 and the weak input beam) may be injected into NLC 2a. The NLC 2a crystal may comprise (e.g., or consist of) a single X-cut LBO crystal at a temperature of approximately 416 K. The 1545 nm and 772.5 nm waves may be polarized on the ordinary axis; the 515 nm wave on the extraordinary axis. Example output pulse energy of the 1545 nm beam and the beam quality factors of the three output beams at the output of NLC 2a are plotted in FIG. 9 and FIG. 10, respectively. FIG. 9 shows a plot of the output pulse energy of the 1545 nm beam after NLC 2a as a function of crystal length. FIG. 10 shows a plot of the beam quality factor of the three output beams from NLC 2a as a function of crystal length. A crystal length of 32 mm is selected since it is sufficiently long to generate a significant amount of gain for the 1545 nm beam and sufficiently short that the 515 nm beam is not significantly depleted and still has a good beam quality factor. The output pulse energy of the 1545 nm wave from NLC 2a may be 40 µJ (e.g., a gain of 40 is generated), and there remains 1.3 mJ of pulse energy in the 515 nm wave. Perfect phase matching may be assumed for the purposes of simulation.

Figure 11:
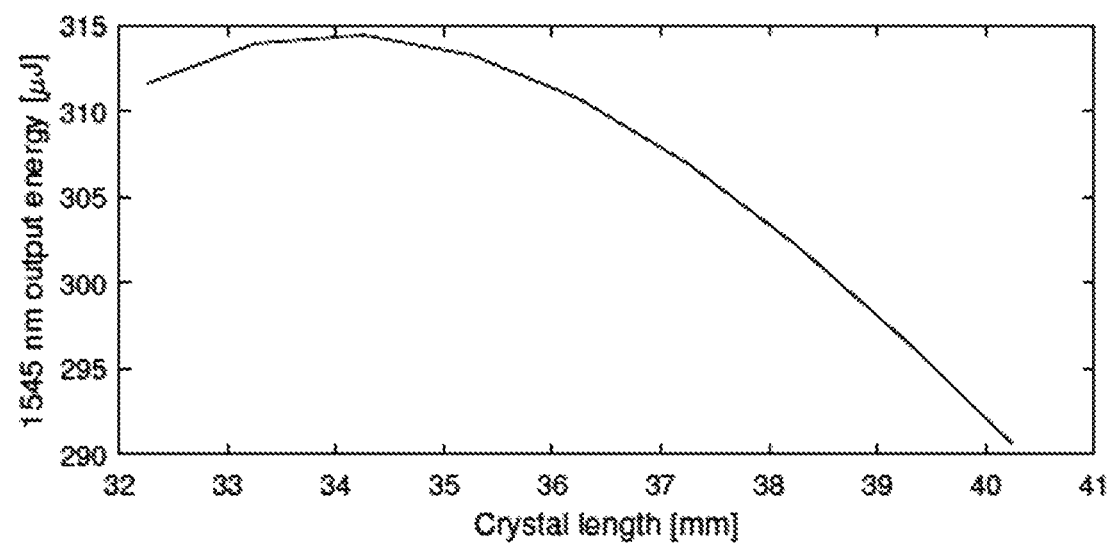
FIG. 11 shows a plot of the output pulse energy of the 1545 nm beam after NLC 2b as a function of crystal length.
Figure 12:
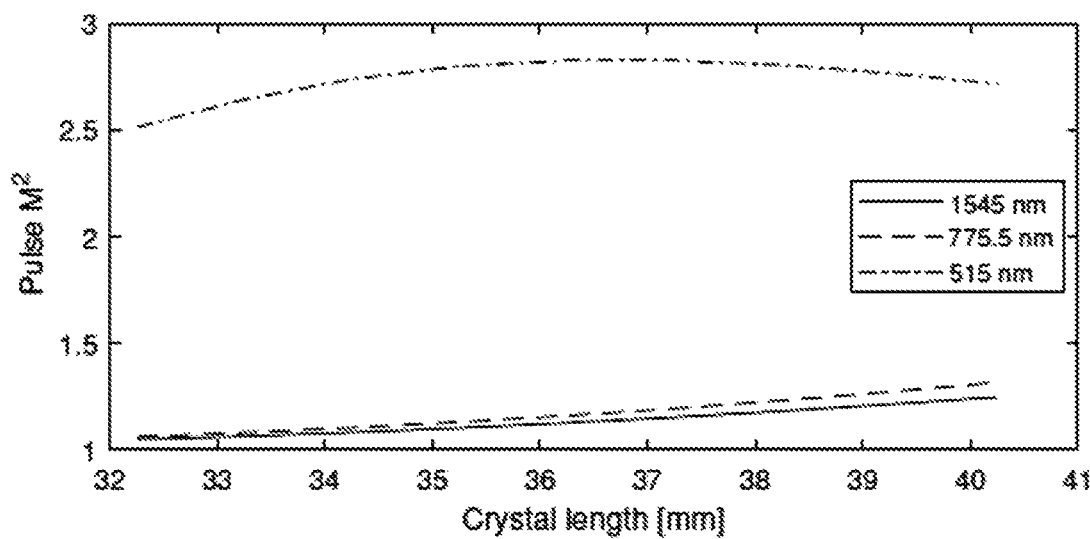
FIG. 12 shows a plot of the beam quality factor of the three output beams from NLC 2b as a function of crystal length.

The 772.5 nm wave from NLC 2a may be discarded by a demultiplexer between NLC 2a and NLC 2b. Alternative designs that drop the 1545 nm wave may yield similar results. The distance between the NLC 2a and 2b crystals may be adjusted to 150 mm such that the 1545 nm beam has a diameter of 0.5 mm FWHM at the entrance to the NLC 2b crystal to match the diameter of the 515 nm pump beam. The NLC 2b may comprise (e.g., or consist of) a single X-cut LBO crystal at a temperature of approximately 416 K. The 1545 nm and 772.5 nm waves may be polarized on the ordinary axis; the 515 nm wave on the extraordinary axis. The output pulse energy of the 1545 nm beam and the beam quality factors of the three output beams at the output of NLC 2b are plotted in FIGS. 11 and 12, respectively. FIG. 11 shows a plot of the output pulse energy of the 1545 nm beam after NLC 2b as a function of crystal length. FIG. 12 shows a plot of the beam quality factor of the three output beams from NLC 2b as a function of crystal length.

Perfect phase matching may be assumed for the purposes of simulation. A crystal length of 34 mm may be selected since it yields the highest pulse energy at 1545 nm while still maintaining good beam quality. Pulse energies of 315 µJ and 550 µJ at 1545 and 772.5 nm, respectively, may be injected into NLC 3.

Figure 13:
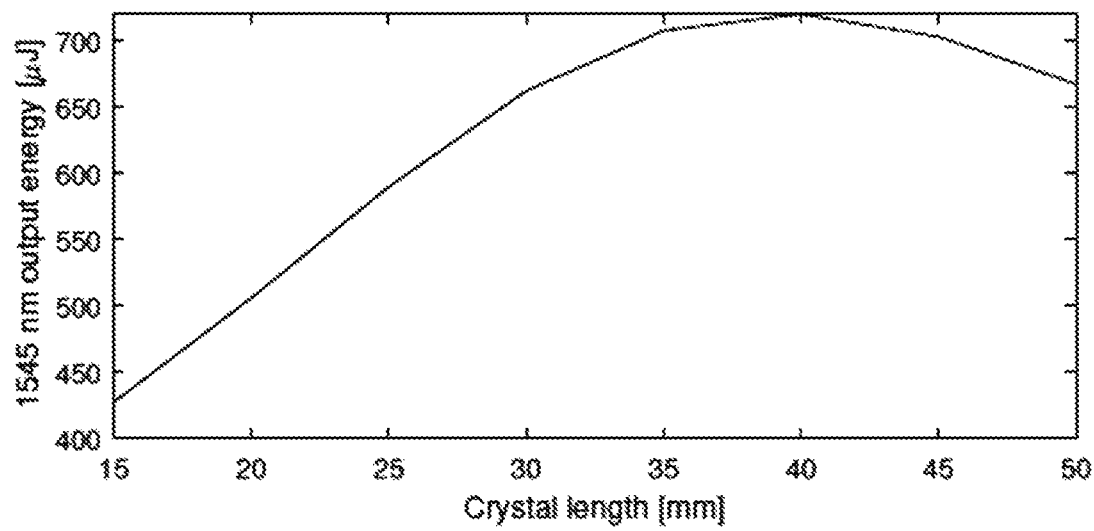
FIG. 13 shows a plot of the output pulse energy of the 1545 nm beam after NLC 3 as a function of crystal length.
Figure 14:
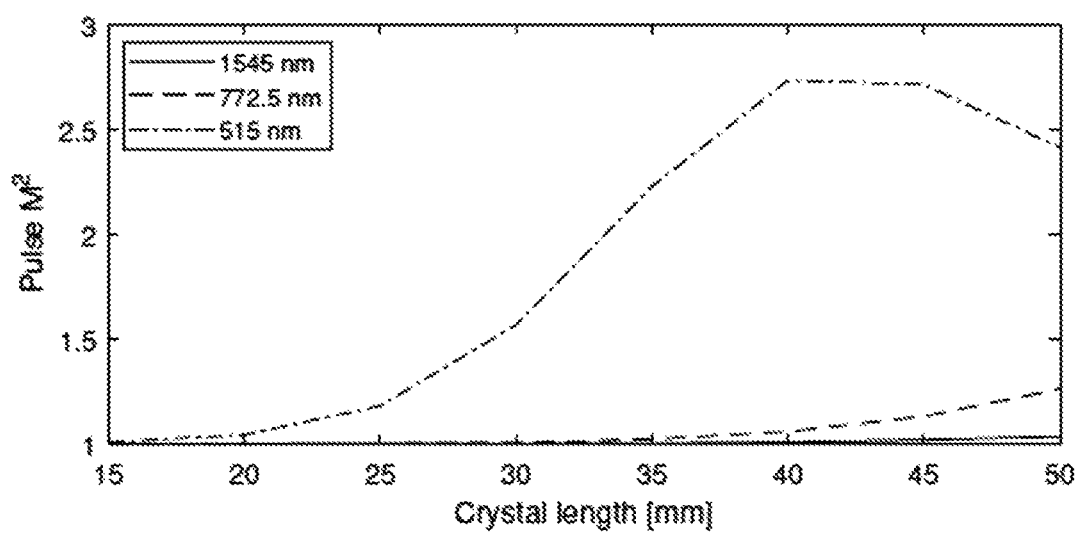
FIG. 14 shows a plot of the beam quality factor of the three output beams from NLC 3 as a function of crystal length.

The NLC 3 may comprise (e.g., or consists of) a single X-cut LBO crystal at a temperature of approximately 388 K. The 1545 nm wave may be polarized on the ordinary axis; the 772.5 nm wave on the extraordinary axis. In order to achieve these polarizations, a waveplate may be inserted between NLC 2b and NLC 3. The thickness of the waveplate may be selected such that it serves as a half-waveplate for the 1545 nm wave and a full waveplate for the 772.5 nm wave. The output pulse energy of the 1545 nm beam and the beam quality factors of the three output beams at the output of NLC 3 are plotted in FIG. 13 and FIG. 14, respectively. FIG. 13 shows a plot of the output pulse energy of the 1545 nm beam after NLC 3 as a function of crystal length. FIG. 14 shows a plot of the beam quality factor of the three output beams from NLC 3 as a function of crystal length.

Perfect phase matching may be assumed for the purposes of simulation. A crystal length of 40 mm may be selected since it yields the highest pulse energy at 1545 nm while still maintaining good beam quality. Pulse energies of 700 µJ at 1545 nm may be achieved.

This analysis predicts a 40% conversion efficiency between the input wave at 515 nm and the output wave at 1545 nm. The conversion efficiency will be less when interface losses and less than perfect phase matching are included. Nonetheless, a conversion efficiency of a few tens of a percent with nearly perfect beam quality is a very attractive result.

The configuration in FIG. 8 has two waves injected into NLC 3 and has a third wave generated in the converter with exactly same wavelength and phase as one of the input waves. In this configuration, the conversion in NLC 3 is dependent on the relative phase of the two input waves. This relative phase would be sensitive to capricious effects like ambient temperature and air currents. To avoid this dependence, one of two aspects of the design can be altered. First, the input seed source can be selected to be at wavelength slightly shifted from the values of 3λ/2 or 3λ/4. As such, NLC 3 would generate two waves slightly shifted in wavelength but still substantially at 3λ/2. As an example, a wavelength may be shifted (e.g., up or down) by one or more of about 0.5% or less, about 1% or less, about 0.5 nm or less, about 1 nm or less, about 5 nm or less, about 10 nm or less, or about 15 nm or less. Alternatively, the injected seed source could have a wavelength of exactly 3λ/2 or 3λ/4, and a nonlinear crystal could be used for NLC 3 whose phase-matching requirements are satisfied when the two waves at the wavelength 3λ/2 are orthogonally polarized.

Additional changes could be advantageous for optimizing the phase matching. For example, the conversion efficiency of each stage could be actively monitored, and the crystals angle tuned to optimize the conversion efficiency. In this configuration, it may be advantageous to cut the crystals rotated off their NCPM orientations so as to increase the phase-matching sensitivity to the angle of the crystal to minimize beam translation when angle tuning.

Figure 15:
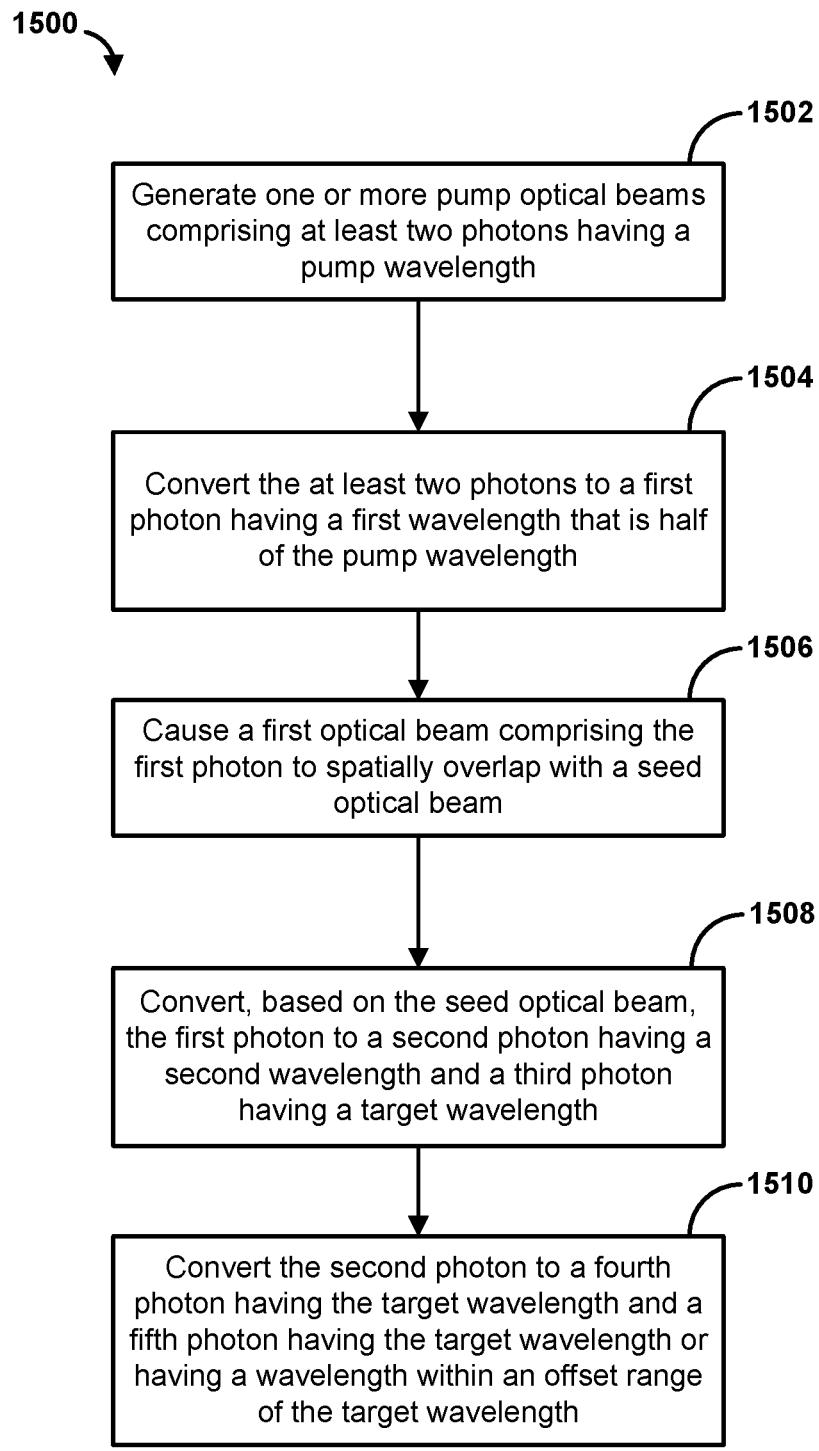
FIG. 15 shows a flowchart of an example method for generating an output light beam.

FIG. 15 shows a flowchart of an example method for generating an output light beam for a pulsed laser. At step 1502, one or more pump optical beams may be generated. The one or more pump beams may comprise at least two photons having a pump wavelength. The one or more optical pump beams may be generated by a laser, such as a pulsed laser, At step 1504, at least two photons may be converted to a first optical beam comprising a first photon having a first wavelength that is half of the pump wavelength. The at least two photons may be converted by a first nonlinear stage, such as the first stage 502 of FIG. 5 and/or FIG. 6. The first nonlinear stage may comprise a nonlinear crystal. The first stage may comprise a frequency doubling stage, a converter stage, and/or the like.

At step 1506, the first optical beam may be caused to spatially overlap (e.g., at least partially spatially overlap) with a seed optical beam. Causing the first optical beam to spatially overlap with the seed optical beam may comprise using a multiplexer to cause the seed optical beam to join an optical path of the first optical beam between the first nonlinear stage and the at least two second nonlinear stages. The seed optical beam may have one or more of a target wavelength or the second wavelength.

The target wavelength may be greater than the pump wavelength. The target wavelength may be greater than the pump wavelength by a factor that is in a range of one or more of about 1.2 to about 1.8, about 1.3 to about 1.7, about 1.4 to about 1.6, or about 1.45 to about 1.55. The target wavelength may be 1.5 times greater than the pump wavelength. The target wavelength and the pump wavelength may be in a range of about 1000 nm to about 1600 nm, about 900 nm to about 1700 nm, or about 800 nm to about 2500 nm.

At step 1508, the first photon may be converted a second photon having a second wavelength and a third photon having the target wavelength. The first photon may be converted to the second photon and the third photon by at least two second nonlinear stages separated by a gap and based on the seed optical beam. The at least second nonlinear stages may comprise at least two amplifier stages, converter stages, and/or the like.

The at least two second nonlinear stages may comprise an initial second stage. The at least two second nonlinear stages may comprise a final second stage. The at least two second nonlinear stages may comprise the initial second stage 604a and the final second stage 604b of FIG. 6. The final stage may be after the initial second stage in an optical path and/or the direction of propagation (e.g., of the beams and/or photons herein). The initial second stage may be configured to output a sixth photon having the target wavelength and a seventh photon having the second wavelength. The final second stage may be configured to convert one or more of the sixth photon or the seventh photon to the second photon and the third photon. The first optical beam may comprise an additional photon having the first wavelength that passes through the initial second stage and is used by the final second stage with the sixth photon or the seventh photon to generate one or more of the second photon or the third photon.

The initial second stage may be separated from the final second stage by the gap. A length of the gap may allow for a beam comprising the sixth photon or the seventh photon to expand to a beam diameter that matches a beam diameter of a beam having the first wavelength. A demultiplexer may be disposed (e.g., in the gap) between the initial second stage and the final second stage may be used to filter out at least portion of a beam comprising the sixth photon or the seventh photon.

The initial second stage may comprise a first nonlinear crystal. The final second stage may comprise a second nonlinear crystal. A length of the first nonlinear crystal along a direction of propagation may one or more of maximize an output power of a beam output from the first nonlinear crystal having the target wavelength or minimize degradation of a beam quality of a beam output from the first nonlinear crystal having the first wavelength. The length of the first nonlinear crystal along the direction of propagation may one or more of generate at least about 90% of the maximum power (e.g., for any length of the first nonlinear crystal) for a beam at the target wavelength output from the first nonlinear crystal or create a beam quality factor that is less than about 1.5 for a beam output from the first nonlinear crystal at the first wavelength.

A length of the second nonlinear crystal along the direction of propagation may one or more of maximize an output power of a beam having the target wavelength output from the second nonlinear crystal or minimize degradation of a beam quality of a beam having the target wavelength output from the second nonlinear crystal. The length of the second nonlinear crystal along the direction of propagation may one or more of generates at least about 90% of the maximum power (e.g., for any length of the second nonlinear crystal) for a beam at the target wavelength output from the second nonlinear crystal or creates a beam quality factor that is less than about 1.5 for a beam at the target wavelength output from the second nonlinear crystal.

At step 1510, the second photon may be converted to a fourth photon and a fifth photon. The fourth photon may have the target wavelength or a wavelength within an offset range of the target wavelength. The fifth photon may have the target wavelength or a wavelength within an offset range of the target wavelength. The second photon may be converted to the fourth photon and the fifth photon by a third nonlinear stage, such as the third stage 506 of FIG. 5 or FIG. 6. The third nonlinear stage may comprise a converter stage. One or more target beams comprising the third photon, the fourth photon, and the fifth photon may be output (e.g., from a converter, from the third nonlinear stage).

The third nonlinear stage may comprise a third nonlinear crystal. The third nonlinear crystal may have a length along a direction of propagation that one or more of maximizes output power of a beam having the target wavelength or minimizes degradation of a beam quality of a beam having the target wavelength. The length along the direction of propagation may one or more of generate at least about 90% of the maximum power (e.g., for any length of the third nonlinear crystal) for a beam at the target wavelength or maintains a beam quality factor less than about 1.5 for a beam having the target wavelength.

The one or more pump optical beams may have a first time-averaged power. The seed optical beam may have a second time-averaged power. An output beam may comprise third time-averaged power. The first time-averaged power and/or third time-averaged power may be greater than the first time-averaged power. The first time-averaged power may be greater than the third time-averaged power. The first time-averaged power may be greater than the second time-averaged power within a range of about 500 times greater to about 10,000 times greater, or about 1000 times greater to about 100,000 times greater. As an example, the first time-averaged power may be in a range of about 1 W to about 10 W or about 1 W to about 100 W of time-averaged power. The second time-averaged power may be in a range of about 1 mW to about 10 mW or about 1 mW to about 100 mW.

Polarization and/or wavelength offsets may be used to address phase matching in the at least the third nonlinear stage. The fourth photon and the fifth photon may either have the target wavelength or have a same polarization. The third nonlinear stage may have a phase-matching requirement that is satisfied if the fourth photon and the fifth photon are orthogonally polarized with respect to each other.

A wavelength of the seed optical beam may be offset from one or more of the target wavelength or the second wavelength by an amount sufficient to decrease dependency by the third nonlinear stage on a relative phase between a beam having the second wavelength and a beam having the target wavelength. A polarization of a first input beam comprising the third photon may be modified, using a waveplate, to have a polarization that is orthogonal to a second input beam comprising the second photon. The first input beam and the second input beam may be supplied to the third nonlinear stage.

As used in the specification and the appended claims, the singular forms "a," "an," and "the" include plural referents unless the context clearly dictates otherwise. Ranges can be expressed herein as from one value (first value) to another value (second value). When such a range is expressed, the range includes in some aspects one or both of the first value and the second value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the designated value, approximately the designated value, or about the same as the designated value. It is generally understood, as used herein, that it is the nominal value indicated±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

What is claimed:

1. A method for generating an output light beam for a pulsed laser, comprising:
    generating one or more pump optical beams comprising at least two photons having a pump wavelength;
    converting, by a first nonlinear stage, the at least two photons to a first photon having a first wavelength that is half of the pump wavelength;
    causing a first optical beam comprising the first photon to spatially overlap with a seed optical beam;
    converting, by at least two second nonlinear stages separated by a gap and based on the seed optical beam, the first photon to a second photon having a second wavelength and a third photon having a target wavelength greater than the pump wavelength; and
    converting, by a third nonlinear stage, the second photon to a fourth photon having the target wavelength and a fifth photon having the target wavelength or having a wavelength within an offset range of the target wavelength.

2. The method of claim 1, further comprising outputting one or more target beams comprising the third photon, the fourth photon, and the fifth photon.

3. The method of claim 1, wherein the at least two second nonlinear stages comprises an initial second stage and a final second stage, wherein the initial second stage is configured to output a sixth photon having the target wavelength and a seventh photon having the second wavelength, and wherein the final second stage is configured to convert the sixth photon or the seventh photon to the second photon and the third photon.

4. The method of claim 3, wherein the first optical beam comprises an additional photon having the first wavelength that passes through the initial second stage and is used by the final second stage with the sixth photon or the seventh photon to generate one or more of the second photon or the third photon.

5. The method of claim 3, wherein a length of the gap allows for a beam comprising the sixth photon or the seventh photon to expand to a beam diameter that matches a beam diameter of a beam having the first wavelength.

6. The method of claim 3, wherein the initial second stage comprises a first nonlinear crystal and the final second stage comprises a second nonlinear crystal, wherein a length of the first nonlinear crystal along a direction of propagation one or more of generates at least about 90% of the maximum power for any length of the first nonlinear crystal for a beam at the target wavelength output from the first nonlinear crystal or creates a beam quality factor that is less than about 1.5 for a beam output from the first nonlinear crystal at the first wavelength, and wherein a length of the second nonlinear crystal along a direction of propagation one or more of generates at least about 90% of the maximum power for any length of the second nonlinear crystal for a beam at the target wavelength output from the second nonlinear crystal or creates a beam quality factor that is less than about 1.5 for a beam at the target wavelength output from the second nonlinear crystal.

7. The method of claim 1, wherein the seed optical beam has one or more of the target wavelength or the second wavelength.

8. The method of claim 1, wherein the target wavelength is greater than the pump wavelength by a factor that is in a range of about 1.2 to about 1.8, about 1.3 to about 1.7, about 1.4 to about 1.6, or about 1.45 to about 1.55, and wherein the target wavelength and the pump wavelength are in a range of about 1000 nm to about 1600 nm, about 900 nm to about 1700 nm, or about 800 nm to about 2500 nm.

9. The method of claim 1, wherein a wavelength of the seed optical beam is offset from one or more of the target wavelength or the second wavelength by an amount sufficient to decrease dependency by the third nonlinear stage on a relative phase between a beam having the second wavelength and a beam having the target wavelength.

10. The method of claim 1, wherein the fourth photon and the fifth photon either have the target wavelength or have a same polarization.

11. A converter comprising:
    a first nonlinear stage configured to receive one or more pump optical beams comprising at least two photons having a pump wavelength and convert the at least two photons to a first photon having a first wavelength that is half of the pump wavelength;
    at least two second nonlinear stages separated by a gap and configured to convert, based on a seed optical beam spatially overlapped with a first optical beam comprising the first photon, the first photon to a second photon having a second wavelength and a third photon having a target wavelength greater than the pump wavelength; and
    a third nonlinear stage configured to convert the second photon to a fourth photon having the target wavelength and a fifth photon having the target wavelength or a wavelength within an offset range of the target wavelength.

12. The converter of claim 11, wherein the third nonlinear stage is configured to output one or more target beams comprising the third photon, the fourth photon, and the fifth photon.

13. The converter of claim 11, wherein the at least two second nonlinear stages comprises an initial second stage and a final second stage, wherein the initial second stage is configured to output a sixth photon having the target wavelength and a seventh photon having the second wavelength, and wherein the final second stage is configured to convert the sixth photon or the seventh photon to the second photon and the third photon.

14. The converter of claim 13, wherein the first optical beam comprises an additional photon having the first wavelength that passes through the initial second stage and is used by the final second stage with the sixth photon or the seventh photon to generate one or more of the second photon or the third photon.

15. The converter of claim 13, wherein a length of the gap allows for a beam comprising the sixth photon or the seventh photon to expand to a beam diameter that matches a beam diameter of a beam having the first wavelength.

16. The converter of claim 11, wherein the third nonlinear stage comprises a nonlinear crystal having a length along the direction of propagation that one or more of generates at least about 90% of the maximum power for any length of the nonlinear crystal for a beam at the target wavelength or maintains a beam quality factor less than about 1.5 for a beam having the target wavelength.

17. The converter of claim 11, wherein the target wavelength and the pump wavelength are in a range of about 1000 nm to about 1600 nm, about 900 nm to about 1700 nm, or about 800 nm to about 2500 nm.

18. The converter of claim 11, wherein a wavelength of the seed optical beam is offset from one or more of the target wavelength or the second wavelength by an amount sufficient to decrease dependency by the third nonlinear stage on a relative phase between a beam having the second wavelength and a beam having the target wavelength.

19. The converter of claim 11, further comprising a waveplate configured to modify a polarization of a first input beam comprising the third photon to have a polarization that is orthogonal to a second input beam comprising the second photon, wherein the first input beam and the second input beam are supplied to the third nonlinear stage.

20. A system comprising:
a first laser configured to generate one or more pump optical beams comprising at least two photons having a pump wavelength;
a first nonlinear stage configured to convert the at least two photons to a first photon having a first wavelength that is half of the pump wavelength;
a multiplexer configured to cause a first optical beam comprising the first photon to spatially overlap with a seed optical beam;
at least two second nonlinear stages separated by a gap and configured to convert, based on the seed optical beam, the first photon to a second photon having a second wavelength and a third photon having a target wavelength greater than the pump wavelength; and
a third nonlinear stage configured to convert the second photon to a fourth photon having the target wavelength and a fifth photon having the target wavelength or a wavelength within an offset range of the target wavelength.

* * * * *